(12) United States Patent
Onodera

(10) Patent No.: US 7,174,186 B2
(45) Date of Patent: Feb. 6, 2007

(54) METHOD FOR SELECTING BROADCASTING TOWER, PROGRAM FOR SELECTING BROADCASTING TOWER, STORAGE MEDIUM STORING SAME PROGRAM AND BROADCAST RECEIVING DEVICE

(75) Inventor: Satoshi Onodera, Tokyo (JP)

(73) Assignee: NEC Corporation, Tokyo (JP)

( * ) Notice: Subject to any disclaimer, the term of this patent is extended or adjusted under 35 U.S.C. 154(b) by 434 days.

(21) Appl. No.: 10/426,992

(22) Filed: Apr. 30, 2003

(65) Prior Publication Data

US 2003/0203715 A1 Oct. 30, 2003

(30) Foreign Application Priority Data

Apr. 30, 2002 (JP) ............... 2002-129248

(51) Int. Cl.
H04B 7/00 (2006.01)
H04Q 7/20 (2006.01)

(52) U.S. Cl. .................. 455/525; 455/3.01; 455/179.1; 455/161.3

(58) Field of Classification Search ............. 455/179.1, 455/525, 278.1, 526, 3.01, 3.04, 524, 160.1, 455/161.3, 184.1, 185.1, 186.1, 226.1, 226.2, 455/226.3, 414.2, 512, 513; 348/723, 555, 348/554, 731, 732, 725
See application file for complete search history.

(56) References Cited

U.S. PATENT DOCUMENTS 5,430,799 A * 7/1995 Katznelson ................. 380/206
6,480,707 B1 * 11/2002 Hirose et al. ............. 455/179.1
6,675,383 B1 * 1/2004 Wheeler et al. ............... 725/19
6,727,960 B2 * 4/2004 Seo ............................. 348/731
6,795,129 B1 * 9/2004 Moriie et al. ................ 348/732
2002/0165983 A1 * 11/2002 Gastaldi ...................... 709/245

FOREIGN PATENT DOCUMENTS

| JP | 5-219484 | 8/1998 |
|----|----------|--------|
| JP | 10-224704 | 8/1998 |
| JP | 10-224705 | 8/1998 |
| JP | 11-55079 | 2/1999 |
| JP | 2001-298674 | 10/2001 |
| JP | 2001-320744 | 11/2001 |

* cited by examiner

Primary Examiner—Edward F. Urban
Assistant Examiner—John J. Lee
(74) Attorney, Agent, or Firm—Scully, Scott, Murphy & Presser, P.C.

(57) ABSTRACT

The broadcasting tower selecting method for selecting one broadcasting tower out of a plurality of broadcasting towers each being able to transmit together broadcast waves on a plurality of channels that can be received in an area, including: a first step of judging an existence or not of the channels that can be received in the area; a second step of extracting, based on a result from the judgment in the first step, one or more broadcasting towers that can provide all channels being receivable in the area out of the plurality of the broadcasting towers; and a third step of selecting one arbitrary broadcasting tower out of the extracted one or more broadcasting towers. Thus, it is possible to select automatically, with an easy operation, a broadcasting tower that can provide best video and audio quality, out of a plurality of broadcasting towers.

13 Claims, 13 Drawing Sheets

*FIG.2*

| broadcasting tower | Tokyo | Hatano | Ashigara | Yugawara | Odawara |
|---|---|---|---|---|---|
| ET | 0 | 1 | 0 | 1 | 1 |

10b; effective broadcasting tower table

FIG.6

10c; wave receivable channel table

| CH | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| DF | 1 | 0 | 1 | 0 | 0 | 0 | 0 | 1 | 0 | 0 | 0 | 1 | 0 | 0 | 0 | 1 | 0 | 0 | 0 | 1 |
| ER | - | - | - | - | - | - | - | 70 | - | - | - | - | - | - | - | - | - | - | - | - |

| CH | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|
| DF | 0 | 1 | 0 | 1 | 0 | 1 | 0 | 1 | 0 | 1 | 0 | 1 | 0 | 0 | 0 | 1 | 0 | 1 | 0 | 0 |
| ER | - | - | - | - | - | 61 | - | 60 | - | 66 | - | - | - | - | - | - | - | 81 | - | - |

| CH | 41 | 42 | 43 | 44 | 45 | 46 | 47 | 48 | 49 | 50 | 51 | 52 | 53 | 54 | 55 | 56 | 57 | 58 | 59 | 60 |
|---|---|---|---|---|---|---|---|---|---|---|---|---|---|---|---|---|---|---|---|---|
| DF | 0 | 1 | 0 | 0 | 0 | 1 | 0 | 0 | 1 | 1 | 1 | 1 | 1 | 1 | 1 | 1 | 1 | 1 | 1 | 1 |
| ER | - | - | - | - | - | - | - | - | - | - | - | - | - | - | 1 | 45 | 2 | 40 | 0 | 43 |

| CH | 61 | 62 |
|---|---|---|
| DF | 1 | 1 |
| ER | - | - |

FIG. 7

*10d; effective broadcasting tower table*

| broadcasting tower | Tokyo | Hatano | Ashigara | Yugawara | Odawara |
|---|---|---|---|---|---|
| ET | 0 | 1 | 0 | 1 | 1 |
| average of error rate | – | 62.3 | – | 42.7 | 1 |
| order of error rate average value | | 3rd | | 2nd | 1st |

FIG.9 (PRIOR ART)

| | Tokyo | 2 | Hatano | 3 | Ashigara | 4 | Yugawara | 5 | Odawara |
|---|---|---|---|---|---|---|---|---|---|
| 1 | NHK general television | 20 | NHK educational TV | 32 | NHK general television | 42 | TV kanagawa | 46 | TV kanagawa |
| 3 | NHK educational TV | 22 | NHK general television | 34 | NHK educational TV | 50 | NHK general television | 49 | NHK general television |
| 4 | Nippon TV network | 24 | Nippon TV network | 36 | Nippon TV network | 52 | NHK educational TV | 51 | NHK educational TV |
| 6 | TBS | 26 | TBS | 38 | TBS | 54 | Nippon TV network | 53 | Nippon TV network |
| 8 | Fuji TV network | 28 | Fuji TV network | 40 | Fuji TV network | 56 | TBS | 55 | TBS |
| 10 | Asahi national broadcasting company | 30 | Asahi national broadcasting company | 42 | Asahi national broadcasting company | 58 | Fuji TV network | 57 | Fuji TV network |
| 12 | TV Tokyo channel 12,Ltd | 32 | TV Tokyo channel 12,Ltd | 44 | TV Tokyo channel 12,Ltd | 60 | Asahi national broadcasting company | 59 | Asahi national broadcasting company |
| 14 | Tokyo metropolitan TV | 36 | TV kanagawa | 38 | TV kanagawa | 62 | TV Tokyo channel 12,Ltd | 61 | TV Tokyo channel 12,Ltd |
| 16 | the university of the air | | | | | | | | |

FIG.13 (PRIOR ART)

10a; wave receivable channel table

| CH | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| DF | 1 | 0 | 1 | 0 | 0 | 0 | 0 | 1 | 0 | 0 | 0 | 1 | 0 | 0 | 0 | 1 | 0 | 0 | 0 | 1 |

| CH | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|
| DF | 0 | 1 | 0 | 1 | 0 | 1 | 0 | 1 | 0 | 1 | 0 | 1 | 0 | 0 | 0 | 1 | 1 | 1 | 0 | 0 |

| CH | 41 | 42 | 43 | 44 | 45 | 46 | 47 | 48 | 49 | 50 | 51 | 52 | 53 | 54 | 55 | 56 | 57 | 58 | 59 | 60 |
|---|---|---|---|---|---|---|---|---|---|---|---|---|---|---|---|---|---|---|---|---|
| DF | 0 | 1 | 0 | 0 | 0 | 1 | 0 | 0 | 1 | 1 | 1 | 1 | 1 | 1 | 1 | 1 | 1 | 1 | 1 | 1 |

| CH | 61 | 62 |
|---|---|---|
| DF | 1 | 1 |

METHOD FOR SELECTING BROADCASTING TOWER, PROGRAM FOR SELECTING BROADCASTING TOWER, STORAGE MEDIUM STORING SAME PROGRAM AND BROADCAST RECEIVING DEVICE

BACKGROUND OF THE INVENTION

1. Field of the Invention

The present invention relates to a method for selecting a broadcasting tower, a program for selecting the broadcasting tower, a storage medium storing same program and a broadcast receiving device, and more particularly to the method for selecting one broadcasting tower out of a plurality of broadcasting towers each being able to transmit together broadcast waves on a plurality of channels being receivable in an area, the program of selecting the broadcasting tower, a storage medium storing same program and the broadcast receiving device to which the above method is applied.

The present application claims priority of Japanese Patent Application No. 2002-129248 filed on Apr. 30, 2002, which is hereby incorporated by reference.

2. Description of the Related Art

A broadcast receiving device receives, through a receiving antenna, broadcast waves transmitted from a broadcasting station or a relay station with a transmitting antenna (hereinafter referred to as a broadcasting station or a like) and, after having performed signal processing an the received broadcast waves, displays a video on its display screen or outputs an amplified audio from a speaker. Therefore, in order for the viewers or a like to watch television, their broadcast receiving devices have to directly receive broadcast waves from the receiving antenna. However, generally, an area in which a receiving antenna can directly receive broadcast waves transmitted from a broadcasting station or a like, those in a VHF (Very High Frequency) band in particular, is limited due to obstructions such as high-rise buildings, mountains, or a like, or due to a difference in magnitude of outputs of broadcast waves.

Moreover, in recent years, though many local TV (television) broadcasting stations and/or local FM (Frequency Modulation) stations (hereinafter, collectively called "local broadcasting stations") providing specially interesting broadcasts for residents in each of areas have been set up, however, due to various conditions of purposes of their establishment, their management sizes or a like, outputs of broadcast waves are not so high. Furthermore, the local TV broadcasting station generally gives broadcasts using broadcast waves in a UHF (Ultra High Frequency) band, however, an area in which broadcast waves in the UHF band can be directly received through the receiving antenna is narrower than that in which broadcast waves in the VHF band can be directly received through the receiving antenna.

To solve this problem, in an area in which direct receipt of broadcast waves is difficult (hereinafter referred to a "broadcast wave hard-to-receive area") or in an area in which many local broadcasting stations are set up, a tower (hereinafter referred to a "broadcasting tower") is conventionally placed which is equipped with a transmitting antenna being able to transmit together broadcast waves on a plurality of broadcasting stations including broadcast waves in the UHF band obtained by conversion of broadcast waves in the VHF band. Hereinafter, a group of channels of broadcasting stations for broadcast waves being transmitted by each of broadcasting towers is called "a channel group". Therefore, in the case of buying a new broadcast receiving device or of movement into the area in which receipt of broadcast waves is difficult, the viewers or a like have to operate the broadcast receiving device so as to automatically select a channel for broadcast waves that can be received in the area.

Next, a conventional method for selecting the broadcasting tower in a TV receiver (television broadcast receiving device) is described below. It is presumed in descriptions below that the receiving antenna installed on a roof of a detached house, a collective house such as an apartment house or a like, is directed toward a broadcasting tower existing in a direction in which broadcast waves providing most excellent video quality or sound quality can be received. It is also presumed that, in an area in which many broadcasting towers are set up, the viewers or a like cannot easily get information about which broadcasting tower a receiving antenna is directed toward. Such the area is, for example, a western region of Kanagawa Prefecture (JAPAN). FIG. 9 is a diagram showing names of places in which broadcasting towers are set up in the western region of Kanagawa Prefecture and in regions surrounding the western region and channels of TV broadcasting stations transmitting broadcast waves from each of the broadcasting towers and commonly called names of the TV broadcasting stations. The channel includes a first channel (in a VHF band) to a sixty-second channel (in a UHF band). Moreover, lower numbers are assigned to each of the channel groups shown in FIG. 9 containing more lower-numbered channels out of the channels from the first channel to sixty-second channel. That is, a broadcasting tower "Tokyo" is a first channel group, a broadcasting tower "Hatano" is a second channel group, a broadcasting tower "Ashigara" is a third channel group, a broadcasting tower "Yugawara" is a fourth channel group, and a broadcasting tower "Odawara" is a fifth channel group. Such the information as shown in FIG. 9 is periodically made public by publications or a like.

First, configurations of the conventional TV receiver are described by referring to FIG. 10. The conventional TV receiver shown in FIG. 10, which is to be connected to a receiving antenna 1, includes a tuner 2, a broadcasting station existence judging section 3, a video/audio processing section 4, a display section 5, a audio outputting section 6, a control section 7, a program storing section 8, a known tower information storing section 9, a receiving broadcasting station storing section 10, and an operation section 11. The tuner 2 converts broadcast signals on a first channel to a sixty-twenty channel which have been received and already converted by the receiving antenna 1, into intermediate frequency signals $S_M$ and feeds them to the video/audio processing section 4 and, at a same time, detects a wave checking signal RWD to be used for judging existence of broadcast waves given by a broadcasting station from the broadcast signals and feeds it to the broadcasting station existence judging section 3. The broadcasting station existence judging section 3, based on the wave checking signal RWD fed from the tuner 2, detects a channel over which telecasting broadcasts are given and feeds a detected result DR to the control section 7. The video/audio processing section 4 performs signal processing on the intermediate frequency signal $S_M$ fed from the tuner 2 to produce a video signal $S_P$ and a audio signal $S_A$ and feeds the video signal $S_P$ to the display section 5 and feeds the audio signal $S_A$ to the audio outputting section 6. The display section 5 has a display unit such as a CRT (Cathode Ray Tube) display unit, a liquid crystal display unit, a plasma display unit, or a like (not shown) and, based on the video signal $S_P$ fed from the video/audio processing section 4, displays a video on the display unit. Moreover, the display section 5, based on a data signal $S_D$ fed from the control section 7, displays various information including a channel that can be received, a broadcasting tower, an instruction to a viewer, or a like on the display unit (not shown). The audio outputting section 6 has a speaker (not shown) and, based on the audio signal $S_A$ fed from the video/audio processing section 4, outputs an amplified audio.

The control section 7 is made up of a CPU (Central Processing Unit) or a like (not shown) and executes a program read from the program storing section 8 to control each of components. For example, the control section 7, based on the detected result DR fed from the broadcasting station existence judging section 3, selects a broadcasting tower from which broadcast waves can be received and lets the tuner 2 receive a plurality of broadcast waves transmitted from the selected broadcasting tower. The program storing section 8 is made up of a semiconductor memory such as a ROM (Read only Memory), RAM (Random Access Memory), flash memory, or a like (not shown) and stores, in advance, various types of program to be executed by the control section 7. The known tower information storing section 9 is made up of a semiconductor memory such as the ROM, RAM, flash memory, or a like (not shown) and stores, in advance, information about all broadcasting towers existing across Japan. The broadcasting tower information includes information about types of broadcast wave given by a broadcasting station that each of the broadcasting towers can transmit, that is, information about the channel group described above. The receiving broadcasting station storing section 10 is made up of a semiconductor memory such as the RAM, flash memory, or a like (not shown) and stores a wave receivable channel table 10a described later (see FIG. 13), information about broadcasting towers or channels that can provide an excellent state of receiving broadcast waves. The operation section 11 has a power switch, volume adjusting key, channel switching keys, various types of function key, a receiving unit to receive a light signal or a wave transmitted from a remote controller (all not shown). The operation section 11 feeds, when various keys or remote controller (not shown) are manipulated by the viewer, a signal corresponding to a type of the manipulated key or to a kind of light signal produced by the manipulation and to time for pressing down the keys or a like, to the control section 7.

Next, a method for selecting the broadcasting tower in the conventional TV receiver having configurations described above is explained below. The viewer, after having connected the conventional TV receiver to the receiving antenna 1, provides power to the TV receiver. Then, the viewer, after having manipulated the operation section 11 or the remote controller (not shown) to set the TV receiver to an automatic channel selection mode, selects "Kanagawa" being his/her resident place. This causes the control section 7 to start automatic channel selecting operation according to a flowchart shown in FIG. 11. That is, the control section 7 first makes its routine proceed to Step SP1 and, after having set a channel flag CH to "1" as an initial value in order to check whether or not broadcast waves on the first channel can be received, to Step SP2.

In Step SP2; the control section 7, based on the detected result DR fed from the broadcasting station existence judging section 3, checks whether or not the broadcasting station existence judging section 3 has judged a broadcasting station corresponding to the targeted channel flag CH to exist. The broadcasting station existence judging section 3, by using a method described below, judges whether or not the broadcasting station exists. The wave checking signal RWD to be fed from the tuner 2 has such a waveform as shown in FIG. 12. Therefore, even if a central frequency of a broadcast wave on a channel is at a specified voltage $V_0$, if the receiving antenna 1 is placed apart even a bit from a broadcasting tower, since an amplitude H becomes extremely small, measurement at a sensitivity level is made impossible and the existence of a broadcasting station cannot be judged based on the sensitivity level. Conventionally, whether or not a broadcasting station corresponding to the channel exist is judged by whether, at a frequency being about a central frequency of the broadcast wave, a waveform of the wave checking signal RWD is at an S-shaped curve being symmetric with respect to the central frequency. As shown in FIG. 12, the waveform of the wave checking signal RWD is at an S-shaped curve being symmetric with respect to a central frequency for a first channel $f_1$ and to a central frequency for a third channel $f_3$, however, the waveform of the wave checking signal RWD is not at the S-shaped curve being symmetric with respect to a central frequency for a second channel $f_2$. Therefore, the waveform of the wave checking signal RWD shows that broadcasting stations corresponding to the first and third channels exist however, a broadcasting station corresponding to the second channel does not exist If a YES answer is obtained as a result from the judgement in Step SP2, that is, if a broadcasting station corresponding to. a targeted channel flag CH is judged to exist, the control section 7 makes its routine proceed to Step SP3. In this example, as is apparent from FIG. 12, since the waveform of the wave checking signal RWD shows that the channel flag CH is "1", that is, the broadcasting station corresponding to the first channel exists, the control section 7 makes its routine proceed to Step SP3. In Step SP3, the control section 7, after having set a detection flag DF for a targeted channel flag CH presented in a wave receivable channel table 10a stored in the receiving broadcasting station storing section 10 to "1", makes its routine proceed to Step SP5. Here, the wave receivable channel table 10a is a table showing a state in which either of "1" or "0" is set to each of the channels including a first to sixty-second channel. Moreover, a detection flag DF for a channel is set to "1" when a broadcasting station corresponding to the channel is judged to exist in Step SP1 and to "0" when the broadcasting station corresponding to the channel is judged not to exist. In this example, since the broadcasting station corresponding to the first channel has been judged to exist, the control section 7, after having set the detection flag DF for the first channel to "1", makes its routine proceed to Step SP5. On the other hand, if a NO answer is obtained as a result from the judgement in Step SP2, that is, if the broadcasting station corresponding to the channel flag CH is judged not to exist, the control section 7 makes its routine proceed to Step SP4.

In Step SP4, the control section 7, after having set the detection flag DF for the channel flag CH presented in the wave receivable channel table 10a to "0", makes its routine proceed to Step SP5.

In Step SP5, the control section 7 judges whether or not the channel flag CH is "62". If a NO answer is obtained at a result from the judgement, the control section 7 makes its routine proceed to Step SP6. In this case, since the channel flag CH is "1" and is not "62", the control section 7 makes its routine proceed to Step SP6.

In Step SP6, the control section 7, having incremented each of values of all the channel flags CH by 1, makes its routine return to Step SP2 and repeats the above processes in Step SP2 to SP4. Then, when the channel flag CH is changed to be "62", a YES answer is obtained in Step SP5 and the control section 7 makes its routine proceed to Step SP7. Thus, by repetition of the processes in Step SP2 to Step SP4 described above, each of the detection flags DF for each of the channels presented in the wave receivable channel table 10a is set to "1" or "0" as shown in FIG. 13.

In Step SP7, the control section 7, after having set a channel group flag CG to "1" as an initial value in order to check whether or not broadcast waves on all the channels belonging to the first channel group (broadcasting channel tower "Tokyo") can be received, makes its routine proceed to Step SP8. In Step SF8, the control section 7 judges whether or not broadcast waves on all the channels belonging to the channel group of the channel group flag CG can be received by referring to information about known towers existing in an area selected by the viewer and existing in its surrounding area out of information about the known towers set up in all parts of Japan being stored in the known tower information storing section 9 and to the wave receivable channel table 10a being stored in the receiving broadcasting station storing section 10. If a NO answer is obtained as a result from the judgement, the control section 7 makes its routine proceed to Step SP9. In the example, as is apparent from comparison between information about broadcasting towers set up in the western region of "Kanagawa" and in regions surrounding the western region of "Kanagawa" shown in FIG. 9 and information provided by the wave receivable channel table 10a shown in FIG. 13, though each of the detection flags DF for the first, third, eighth, twelfth, sixteenth channels belonging to the first channel group (broadcasting channel tower "Tokyo") is set to "1", each of the detection flags DF for the fourth, sixth, tenth, or fourteenth channels belonging to the first channel group (broadcasting channel tower "Tokyo") is set to "0". Therefore, the control section 7 makes its routine proceed to Step SP9.

In Step SP9, the control section 7, having incremented the values of the channel group flag CG by 1 in order to check whether or not broadcast waves on all the channels belonging to the second channel group (broadcasting channel tower "Hatano") can be received, makes its routine return to Step SP8 and then repeats the above process in Step SP8. When broadcast waves on all channels belonging to the second channel group indicated by the channel group flag CG are judged to be able to received by referring to the known tower information (see FIG. 9) and the wave receivable channel table 10a (see FIG. 13), a result from the judgement in Step SP8 becomes a YES answer, and the control section 7 makes its routine proceed to Step SP 10. In the example, as is apparent from comparison between the above tables in FIGS. 9 and 13, since each of the detection flags DF of all channels belonging to the second channel group (broadcasting tower "Hatano") is set to "1", if a value of the channel group flag CG is "2", the control section 7 makes its routine proceed to Step SP 10. In Step SP 10, the control section 7, after having registered a broadcasting tower which possesses the channel group corresponding to a value of the targeted channel group flag CG, as an effective broadcasting tower, on the receiving broadcasting storing section 10, terminates a series of the related processes. Therefore, in this example, the control section 7 registers the broadcasting tower "Hatano", as an effective broadcasting tower, on the receiving broadcast storing section 10.

However, in the conventional method for selecting a broadcasting station, since channel groups are compared in ascending order of its number in the waver receivable channel table 10a in the processes in Step SP7 to SP10, in spite of a fact that a viewer lives in Odawara city and that the broadcasting station "Odawara" is placed in the Odawara city, since the broadcasting tower "Hatano" is the second channel group and the broadcasting tower "Odawara" is the fifth channel group, the control section 7 registers the broadcasting tower "Hatano" being set up in Hatano city being positioned far from the Odawara city as an effective broadcasting tower on the receiving broadcast storing section 10.

Thus, in the conventional method for selecting a broadcasting tower, in some cases, there is a risk that such a broadcasting station as provides lower video and audio quality is registered as an effective broadcasting tower. In such circumstances, in order to set a broadcasting station that can provide best video and audio quality out of a plurality of broadcasting towers being set up in the area where the viewer lives, the viewer has to change each of the channels one by one, which causes much expense in time and effort. Moreover, in the case of the viewer who cannot change each of the channels one by one, the viewer has to contact an electric goods store or a service company to have the channels changed one by one, which needs much time and costs. Almost the same inconveniences as described above occur in areas in which many local FM broadcasting stations are set up.

SUMMARY OF THE INVENTION

In view of the above, it is an object of the present invention to provide a method for selecting a broadcasting tower which is capable of automatically selecting the broadcasting tower that can provide best video and audio quality out of a plurality of broadcasting towers being set up in an area in which receipt of broadcast waves is difficult and/or many local broadcasting stations are setup, a program of selecting the broadcasting tower, a storage medium storing same program and a broadcast receiving device to which the above method is applied.

According to a first aspect of the present invention, there is provided a broadcasting tower selecting method for selecting one broadcasting tower out of a plurality of broadcasting towers each being able to transmit together broadcast waves on a plurality of channels that can be received in an area, including:

first step of judging an existence or not of the channels that can be received in the area;

a second step of extracting, based on a result from the judgment in the first step, one or more broadcasting towers that can provide all channels being receivable in the area out of the plurality of the broadcasting towers; and a third step of selecting one arbitrary broadcasting tower out of the extracted one or more broadcasting towers.

In the foregoing first aspect, a preferable mode is one wherein, in the third step, after programs on each channel transmitted from the extracted one or more broadcasting towers have been presented to a viewer or a listener, the one arbitrary broadcasting tower specified by the viewer or the listener is selected out of the extracted one or more broadcasting towers.

Another preferable mode is one wherein, in the first step, an error rate occurring when error correction is made to a data signal contained in a broadcasting signal on the each channel is calculated and wherein, in the third step, a broadcasting tower having a minimum value of the error rate for the each channel being transmitted from the extracted one or more broadcasting towers is selected.

Still another preferable mode is one that wherein further includes a fourth step of recognizing, based on information about the selected broadcasting tower, an area in which a broadcast receiving device is located.

According to a second aspect of the present invention, there is provided a broadcast receiving device including:

a broadcasting station judging section to judge existence of broadcast channels that can be received; and a control section to extract, based on a result from the judgment, one or more broadcasting towers that can provide all channels being receivable in an area out of the plurality of the broadcasting towers each being able to transmit together broadcast waves on a plurality of channels that can be received in the area and to select one arbitrary broadcasting tower out of the extracted one or more broadcasting towers.

In the foregoing second aspect, a preferable mode is one wherein the control section, after having presented programs on each channel transmitted from the extracted one or more broadcasting towers to a viewer or a listener, selects the broadcasting tower specified by the viewer or the listener out of the extracted one or more broadcasting towers.

Another preferable mode is one that wherein further includes an error correction processing section to calculate an error rate occurring when error correction is made to a data signal contained in a broadcasting signal on the each channel and wherein, the control section selects the broadcasting tower having a minimum value of the error rate for the each channel being transmitted from the extracted one or more broadcasting towers.

Still another preferable mode is one wherein the control section recognizes, based on information about the selected broadcasting tower, an area in which the broadcast receiving device is located.

According to a third aspect of the present invention, there is provided a broadcasting tower selecting program to have a computer execute a method for selecting one broadcasting tower out of a plurality of broadcasting towers each being able to transmit together broadcast waves on a plurality of channels that can be received in an area, the method including:

a first step of judging an existence or not of the channels that can be received in the area;

a second step of extracting, based on a result from the judgment in the first step, one or more broadcasting towers that can provide all channels being receivable in the area out of the plurality of the broadcasting towers; and a third step of selecting one arbitrary broadcasting tower out of the extracted one or more broadcasting towers.

In the foregoing third aspect, a preferable mode is one wherein, in the third step, after programs on each channel transmitted from the extracted one or more broadcasting towers have been presented to a viewer or a listener, the one arbitrary broadcasting tower specified by the viewer or the listener is selected out of the extracted one or more broadcasting towers.

Another preferable mode is one wherein, in the first step, an error rate occurring when error correction is made to a data signal contained in a broadcasting signal on the each channel is calculated and wherein, in the third step, a broadcasting tower having a minimum value of the error rate for the each channel being transmitted from the extracted one or more broadcasting towers is selected.

Still another preferable mode is one that wherein further includes a fourth step of recognizing, based on information about the selected broadcasting tower, an area in which a broadcast receiving device is located.

According to a fourth aspect of the present invention, there is provided a storage medium storing a broadcasting tower selecting program to have a computer execute a broadcasting tower selecting method for selecting one broadcasting tower out of a plurality of broadcasting towers each being able to transmit together broadcast waves on a plurality of channels that can be received in an area, the method including:

a first step of judging an existence or not of the channels that can be received in the area;

a second step of extracting, based on a result from the judgment in the first step, one or more broadcasting towers that can provide all channels being receivable in the area out of the plurality of the broadcasting towers; and a third step of selecting one arbitrary broadcasting tower out of the extracted one or more broadcasting towers.

With another configuration, by using a fifth step of recognizing, based on information related to the selected broadcasting tower, an area in which a broadcast receiving device is located, rough recognition of the area in which the broadcast receiving device is positioned. This enables a viewer to obtain only information which is really needed, thus improving usability of the broadcast receiving device. Moreover, this enables a broadcasting station to work out a set-up plan of various broadcasting equipment in the area.

BRIEF DESCRIPTION OF THE DRAWINGS

The above and other objects, advantages, and features of the present invention will be more apparent from the following description taken in conjunction with the accompanying drawings in which:

FIG. 2 is a diagram showing an example of configurations of an effective broadcasting tower table employed in the first embodiment of the present invention;

FIG. 6 is a diagram showing an example of configurations of a wave receivable channel table making up part of a receiving broadcasting station storing section employed in the second embodiment of the present invention;

FIG. 7 is a diagram showing an example of configurations of an effective broadcasting tower table employed in the second embodiment of the present invention;

FIG. 9 is a diagram showing names of places in which broadcasting towers are set up in a western region of Kanagawa Prefecture and in regions surrounding the western region and channels of TV broadcasting stations transmitting broadcast waves from each of the broadcasting towers and commonly called names of the TV broadcasting stations;

FIG. 13 is a diagram showing an example of a configuration of a receiving channel table being a part of a receiving broadcasting station storing section making up the TV receiver.

DETAILED DESCRIPTION OF THE PREFERRED EMBODIMENTS

Best modes of carrying out the present invention will be described in further detail using various embodiments with reference to the accompanying drawings.

First Embodiment

Figure 10:
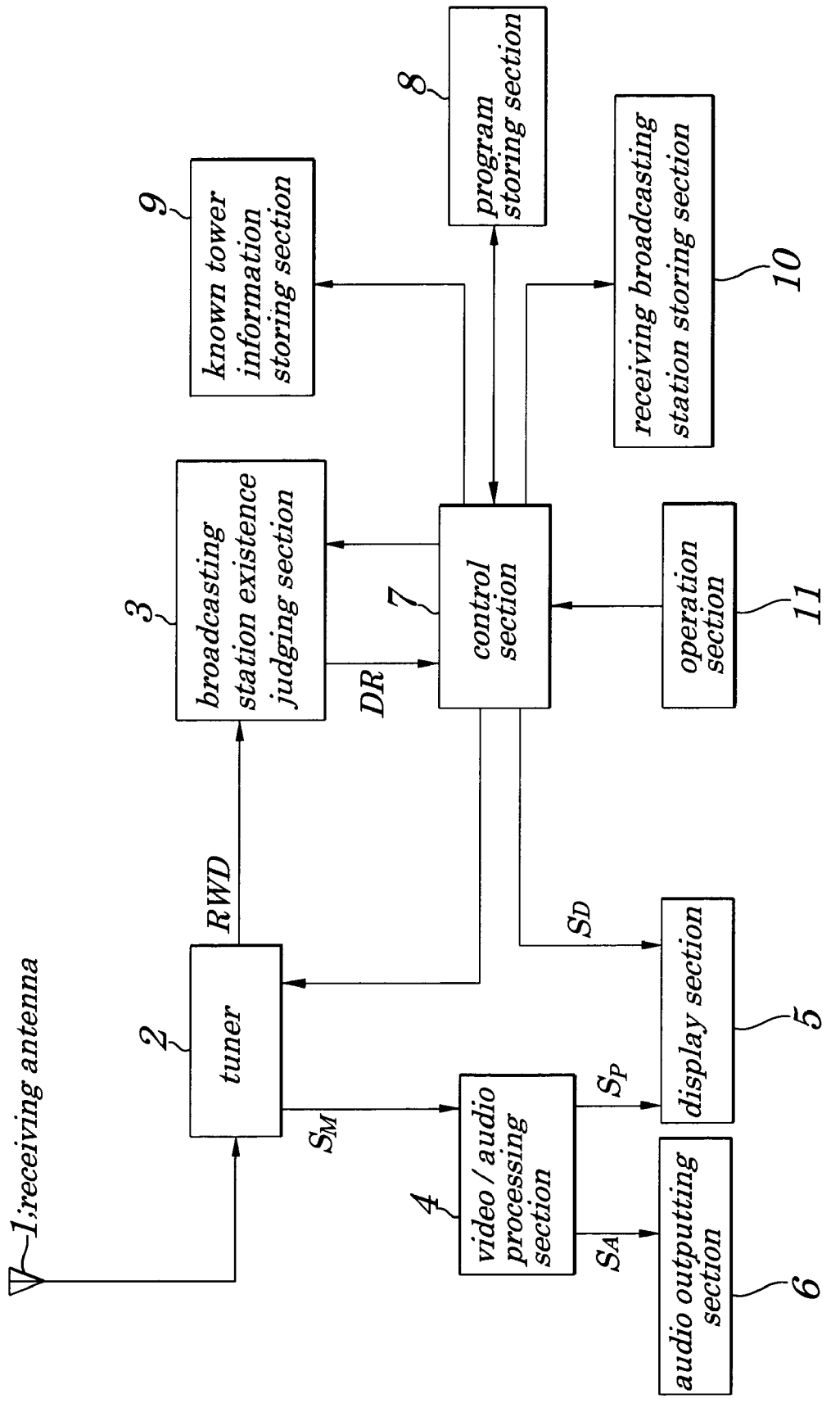
FIG. 10 is a schematic block diagram showing configurations of a conventional TV receiver.

First, let it be assumed that a TV receiver employed in a first embodiment has approximately the same configurations as the conventional TV receiver shown in FIG. 10. However, processing of an automatic channel selection to be performed by a control section is different from that to be performed by a control section in the conventional method, details of which are described later.

Figure 1:
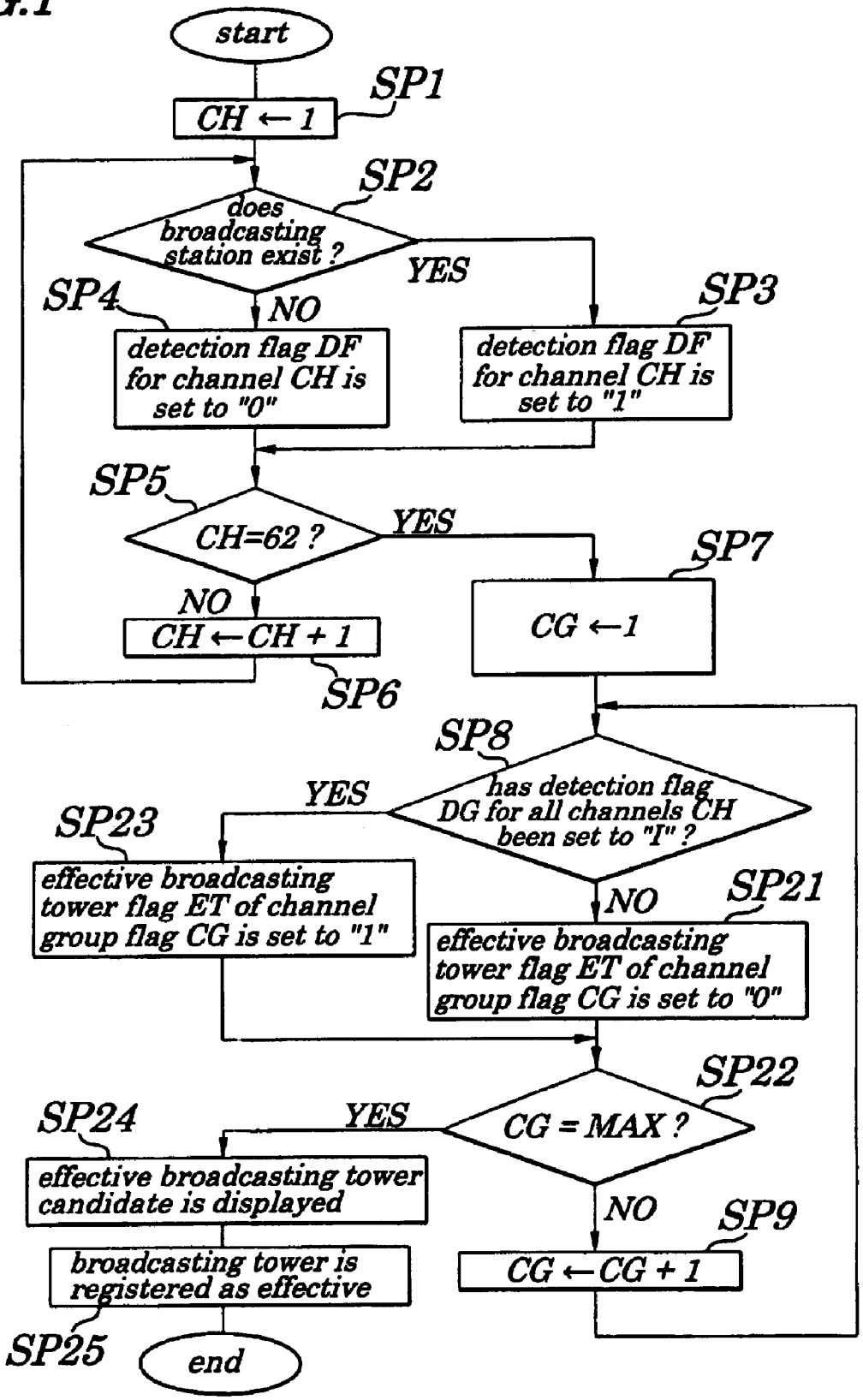
FIG. 1 is a flowchart explaining a method for selecting a broadcasting tower according to a first embodiment of the present invention.
Figure 11:
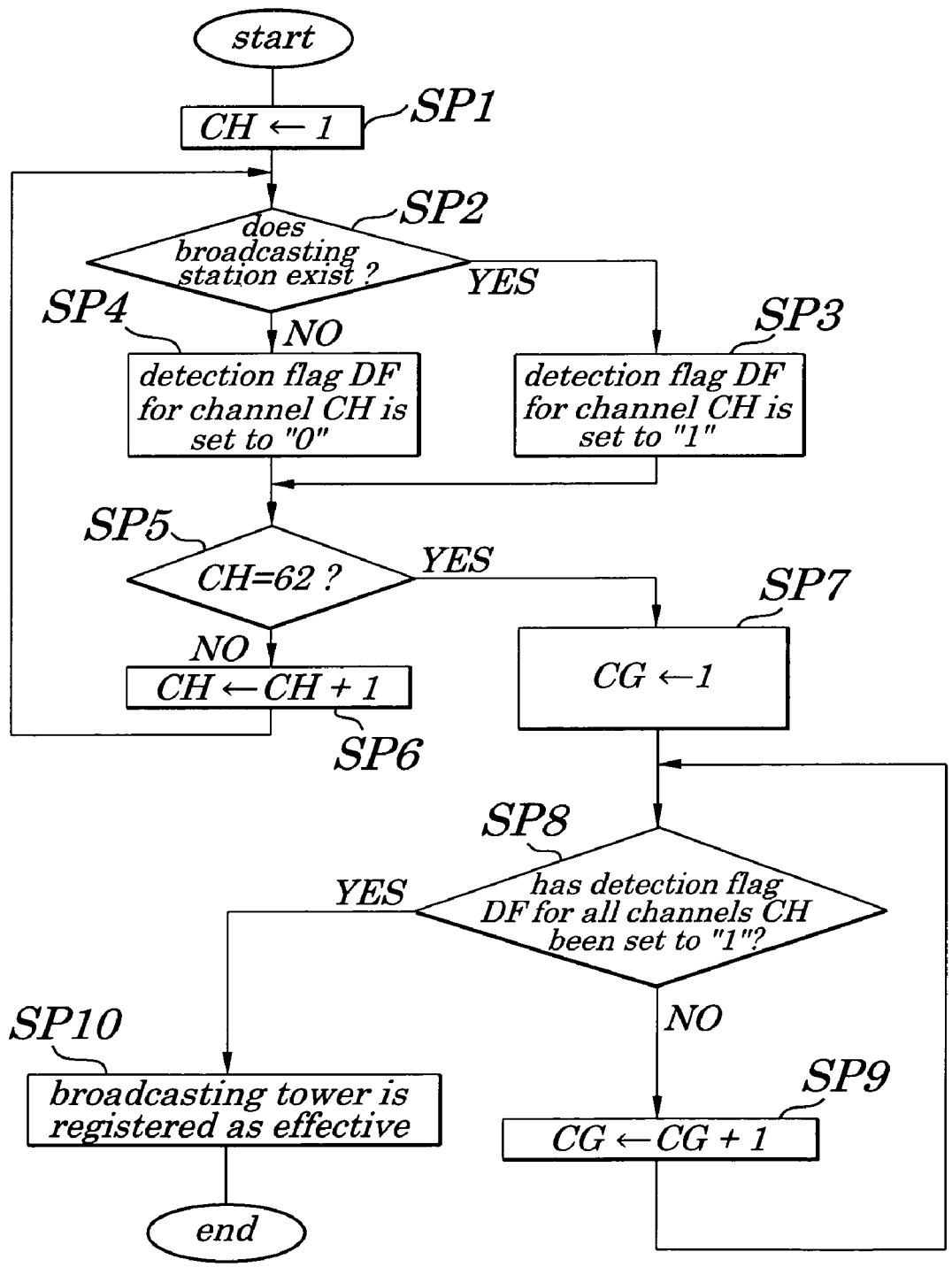
FIG. 11 is a flowchart explaining a conventional method of selecting a broadcasting tower.

Next, a method for selecting a broadcasting tower of the first embodiment is described below. A viewer, after having connected a TV receiver to a receiving antenna 1, provides power to the TV receiver. Then, the viewer, after having operated an operation section 11 or a remote controller (not shown) to set the TV receiver to an automatic channel selection mode, selects "Kanagawa" being a place of his/her residence. This causes a control section 7 to start processing of automatic channel selection in accordance with a flowchart as shown in FIG. 1. As is apparent from comparison between flowcharts shown FIG. 1 and FIG. 11, Step SP1 to Step SP7 in FIG. 1 are the same as those in FIG. 11 in process. Therefore, processes in Step SP8 and thereafter being features of the present invention are mainly explained hereinafter. FIG. 9 and FIG. 13 are also referred to in description of this embodiment.

As described above, since processing in Step SP2 to SP4 is repeated, each of detection flags DF for each of channels presented in a wave receivable channel table 10a is set to "1" or "0" as shown in FIG. 13. In Step SP8, the control section 7 judges whether or not broadcast waves on all channels belonging to a channel group corresponding to a channel group flag CG can be received by referring to information about known towers existing in an area selected by the viewer and in its surrounding area out of information about the known towers set up in all parts of Japan being stored in known tower information storing section 9 and to a wave receivable channel table 10a being stored in a receiving broadcasting station storing section 10. If a NO answer is obtained as a result from the judgement, the control section 7 makes its routine proceed to Step SP21. In the example, as is apparent from comparison between information about broadcasting towers set up in a western region of Kanagawa Prefecture (in Japan) and in regions surrounding the western region shown in FIG. 9 and information contained in the wave receivable channel table 10a shown in FIG. 13, though each of the detection flags DF for the first, third, eighth, twelfth, sixteenth channels belonging to the first channel group (broadcasting channel tower "Tokyo") is set to "1", each of the detection flags DF for the fourth, sixth, tenth, or fourteenth channels belonging to the first channel group (broadcasting channel tower "Tokyo") is set to "0". Therefore, the control section 7 makes its routine proceed to Step SP21.

In Step SP21, the control section 7 sets an effective broadcasting tower candidate flag ET, corresponding to the channel group indicated by the targeted channel group flag CG, to "0", wherein the effective broadcasting tower candidate flag ET is provided in an effective broadcasting tower table 10b (see FIG. 2), and then makes its routine proceed to Step SP22.

Here, the effective broadcasting tower table 10b is stored in the receiving broadcasting station storing section 10 so as to represent a state in which either of "1" or "0" is set to each of the effective broadcasting tower flags ET for broadcasting stations contained in information about known broadcasting towers existing in an area selected by the viewer and in its surrounding area. Moreover, an effective broadcasting tower candidate flag ET is set to "1" when it is judged in Step SP8 that broadcast waves on all channels belonging to a channel group corresponding to a channel group flag CG for a broadcasting tower can be received in order to let the broadcasting tower become one candidate for an effective broadcasting tower and is set to "0" when it is judged in Step SP8 that the broadcast waves cannot be received in order to let the broadcasting tower not become one candidate for an effective broadcasting tower. In the example, since it is judged in Step SP8 that the broadcast waves on all the channels belonging to the first channel group (broadcasting channel tower "Tokyo") cannot be received, the control section 7, after having set the effective broadcasting tower candidate flag ET for the first channel group (broadcasting channel tower "Tokyo") to "0", makes its routine proceed to Step SP22.

In Step SP22, the control section 7 judges whether or not a value of the channel group flag CG is equal to a maximum value MAX. If a NO answer is obtained as a result from the judgement, the control section 7 makes its routine proceed to Step SP9. In the example, since the maximum value MAX is "5" (see FIG. 9) and the value of the channel group flag CG is "1", the control section 7 makes its routine proceed to Step SP9. In Step SP9, the control section 7, after having incremented a value of the channel group flag CG by "1", makes its routine proceed to Step SP8.

If a YES answer is obtained as a result from the judgement in Step SP8, that is, when broadcast waves on all the channels belonging to the channel group corresponding to the channel group flag CG are judged to be able be received by referring to information about known towers existing in the area selected by the viewer and in its surrounding area out of information about the known towers set up in all parts of Japan being stored in the known tower information storing section 9 and to the wave receivable channel table 10a being stored in the receiving broadcasting station storing section 10, the control section 7 makes its routine proceed to Step SP23. In the example, as is apparent from comparison between the tables in FIGS. 9 and 13, since each value of the detection flags DF of all channels belonging to the second channel group (the broadcasting tower "Hatano"), the fourth channel group (the broadcasting tower "Yugawara"), and the fifth channel group (the broadcasting tower "Odawara") is set to "1", if the value of the channel group flag CG is 2, 4, or 5, the control section 7 makes its routine proceed to Step SP23.

In Step SP23, the control section 7, after having set an effective broadcasting tower candidate flag ET for the targeted channel group flag CG being presented in the effective broadcasting tower table 10b shown in FIG. 2 to "1", makes its routine proceed to Step SP22. In the example, as shown in FIG. 2, when the value of the channel group flag CG is set to 2, 4, or 5, the control section 7 sets the corresponding effective broadcasting tower candidate flag ET to "1".

Figure 3:
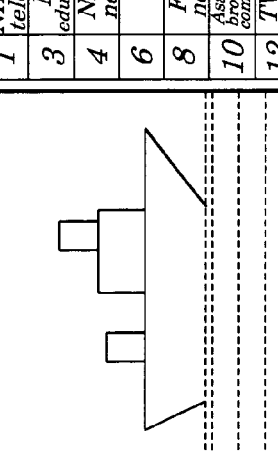
FIG. 3 is a diagram showing examples of screens for confirming states in which broadcast waves are being received to be displayed on a display unit.

Then, when the channel group flag CG becomes a MAX value, a YES answer is obtained as a result from the judgement in Step SP22, the control section 7 makes its routine proceed to Step SP24. In the example, when the value of the channel group flag CG becomes 5, the control section 7 makes its routine proceed to Step SP24. In Step SP24, the control section 7 feeds a specified data signal $S_D$ to a display section 5 to instruct the display section 5 to display, for example, as shown in FIG. 3, a wave receivable channel table 21, a broadcasting tower table 22, selection buttons 23, to 23₃ and, at a same time, controls a tuner 2 to provide an instruction for switching of a channel of a broadcasting station to be displayed on a display unit according to operations of an operation section 11 and a remote controller (not shown) performed by a viewer. This causes a TV (television) screen 24 on a channel selected by the viewer, together with the wave receivable channel table 21, broadcasting tower table 22, selection buttons $23_1$ to $23_3$, to be displayed on the display unit. Moreover, an amplified audio corresponding to the TV screen 24 is output from a speaker (not shown).

In the wave receivable channel table 21 shown in FIG. 3, some contrivances are provided so that the viewer can more easily understand contents of the wave receivable channel table 10a shown in FIG. 13. That is, instead of the "CH" for the channel flag in the wave receivable channel table 10a shown in FIG. 13, a word "channel" is used in the wave receivable channel table 21 shown in FIG. 3. Similarly, instead of "DF" for the detection flag, a word "Existence or not" is used and, instead of "1" or "0" used to express a value of the detection flag, a mark "O" or "X" is used. Moreover, the broadcasting tower, table 22 shown in FIG. 3 has the same contents as the broadcasting tower table shown in FIG. 9 and, in the broadcasting tower table 22, broadcasting towers and channels that have been selected by the viewer are displayed in a highlighted manner. That is, in the broadcasting tower table 22 shown in FIG. 3, a broadcasting tower "Hatano" expressed by hatch lines (being highlighted) has been selected and a channel "NHK Educational Television" expressed by hatch lines (being highlighted) has been selected. Therefore, on the TV screen 24, a program brought by broadcast waves on a twentieth channel "NHK Educational Television" transmitted from the broadcasting tower "Hatano" is displayed.

Moreover, each of the selection buttons $23_1$ to $23_3$ corresponds to any one of broadcasting towers "Tokyo", "Hatano", "Ashigara", "Yugawara", and "Odawara" for which effective broadcasting tower candidate flags ET are set to "1" in Step SP23 and is displayed in an upper part of the broadcasting tower table 22. The selection buttons $23_1$ to $23_3$ are used when the viewer selects a broadcasting tower as an effective broadcasting tower by highlighting any one of the selection buttons $23_1$ to $23_3$ and then pressing down a determination key or a like in the operation section 11 or in the remote controller (not shown).

Therefore, the viewer manipulates the operation section 11 or the remote controller (not shown) in order to select each of the channels to be transmitted from the broadcasting tower indicated by any one of the selection buttons $23_1$ to $23_3$ and actually watches the TV screen 24 shown in FIG. 3 and listens to audios from a TV receiver so as to select a broadcasting tower which can provide many channels having excellent video and audio quality and to determine the selected broadcasting tower and then, after having highlighted any one of the selection buttons $23_1$ to $23_3$, presses down the determination key or the like. In the example, let it be assumed that a viewer selects the broadcasting tower "Odawara" and determines it and, after having highlighted the selection button $23_3$, presses down the determination key or the like. This causes the: operation section 11 to feed a signal corresponding to an operation of the viewer to the control section 7 and therefore the control section 7 makes its routine proceed to Step SP25. In Step SP25, the control section 7, after having stored the broadcasting tower corresponding to the signal fed from the operation section 11 as an effective broadcasting tower in the receiving broadcasting station storing section 10, terminates a series of processing. In the embodiment, the control section 7 stores the broadcasting tower "Odawara" as the effective broadcasting tower in the receiving broadcasting station storing section 10.

Thus, according to the method for selecting a broadcasting tower employed in the embodiment, a viewer selects an effective broadcasting tower candidate from which broadcast waves on all channels belonging to a channel group corresponding to a channel group flag CG can be received, out of a plurality of broadcasting towers set up in an area in which receipt of broadcast waves is difficult or in an area in which many local broadcasting stations exist and can actually watch a TV program consisting of broadcast waves transmitted from the effective broadcasting tower candidate so as to select a broadcasting tower which can provide best video and audio quality. Therefore, unlike in the conventional case, there is no fear that a broadcasting tower providing poor video and audio quality is registered as an effective broadcasting tower. As a result, neither a process in which the viewer changes each of channels one by one, being provided to set a broadcasting tower which can provide best video and audio quality nor a process in which the viewer contacts an electric goods store or a service company to have it perform setting for the broadcasting tower which can provide best video and audio quality is required. This makes it possible for the viewer, even in the case where he/she buys a new TV receiver or moves to another area, to immediately enjoy a TV broadcast that can provide best video and audio quality.

Second Embodiment

Figure 4:
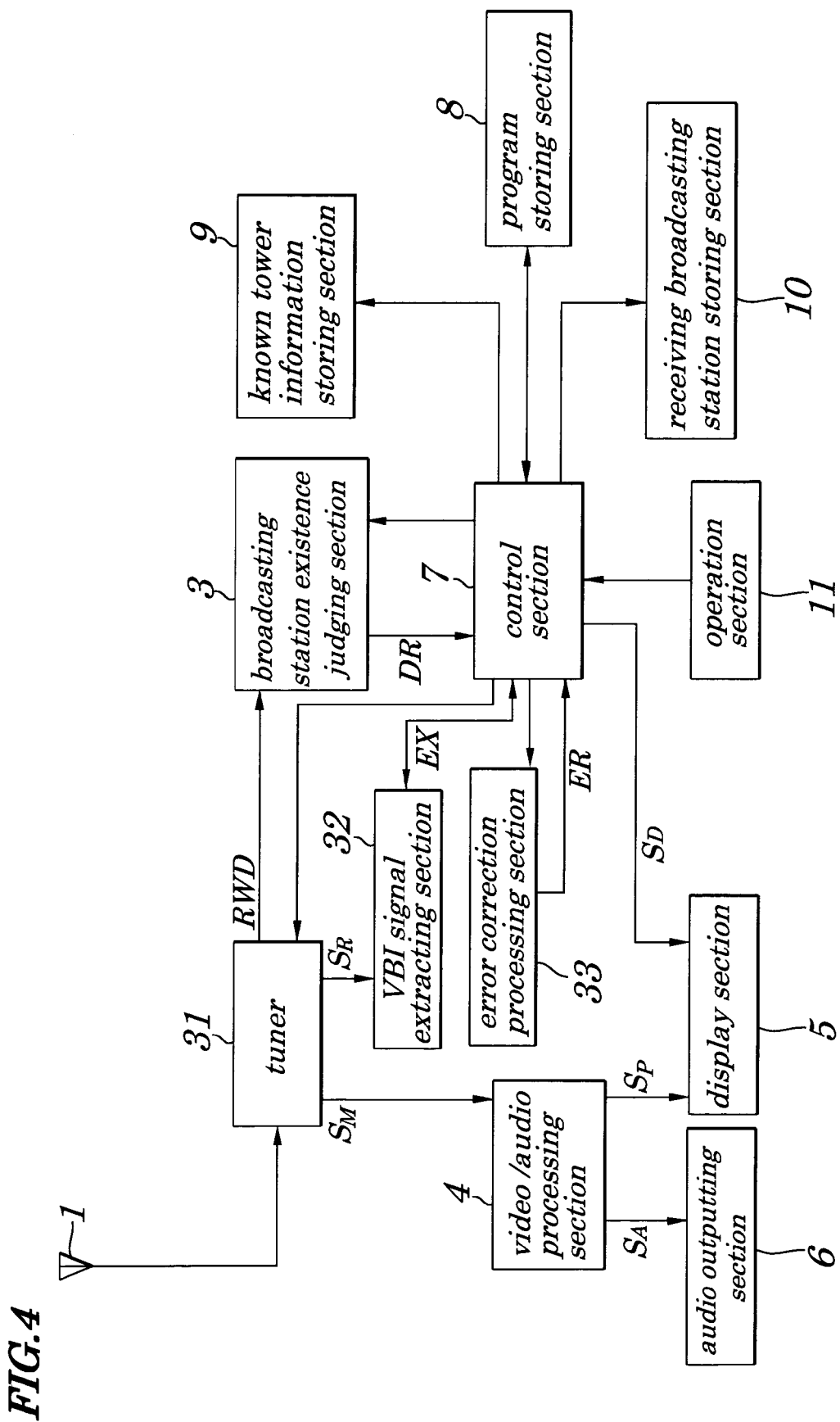
FIG. 4 is a schematic block diagram showing configurations of a TV receiver to which a method for selecting a broadcasting tower is applied according to a second embodiment of the present invention.

FIG. 4 is a schematic block diagram showing configurations of a TV receiver to which a method for selecting a broadcasting tower of a second embodiment of the present invention is applied. In FIG. 4, same reference numbers are assigned to each component having the same functions as each of the component shown in FIG. 10 and its description is omitted accordingly. The TV receiver shown in FIG. 4 is provided newly with a tuner 31 instead of a tuner 2 shown in FIG. 10 and with a VBI (Vertical Blanking Interval) signal extracting section 32 and an error correction processing section 33.

Here, a VBI signal (not shown in FIG. 4) represents a data signal inserted into a VBI being intervals among signals. The VBI signal is used to display a character being superimposed on a TV screen or to associate information within a Web page managed by a broadcasting station with information being displayed on the TV screen by connecting the Internet to the TV receiver. Moreover, the VBI signal, since it is a digital signal, is easily influenced by noises and, as a result, data of the VBI signal is made quite different from its original data thus causing an error to occur readily. As a receiving antenna 1 is placed far from a broadcasting tower, noises increases more and therefore when the VBI signal is extracted from a broadcast signal, more error occurs easily.

To solve this problem, an error correction signal is added to the VBI signal so that data can be exactly transmitted even if the VBI signal is affected by noises. Normally, processes of correcting errors proceed gradually from its weak stage to its strong stage and continue until no errors occur. A number of times of the error correcting processing is an error rate. Therefore, in the embodiment, when the error rate becomes smaller, a distance between the receiving antenna 1 and a broadcasting tower is recognized as shorter and, as a result, a broadcasting tower that can provide a minimum error rate out of a plurality of broadcasting towers is registered as an effective broadcasting tower.

The tuner 31 has a function, in addition to functions that the tuner 2 shown in FIG. 10 has, of feeding a broadcast signal $S_R$ to the VBI signal extracting section 32. The VBI signal extracting section 32 extracts a VBI signal from the broadcast signal $S_R$ in accordance with an instruction for extracting the VBI signal provided from a control section 7 and feeds the extracted VBI signal to the error correction processing section 33 and, at a same time, feeds an extraction signal EX indicating that the VBI signal has been extracted to the control section 7. The error correction processing section 33, after having performed processing of error correction to the VBI signal in accordance with an instruction for starting processing of the error correction provided from the control section 7, feeds an error rate ER measured at the time of error correction to the control section 7.

Next, a method for selecting a broadcasting tower in the TV receiver having configurations described above is explained below.

Figure 5:
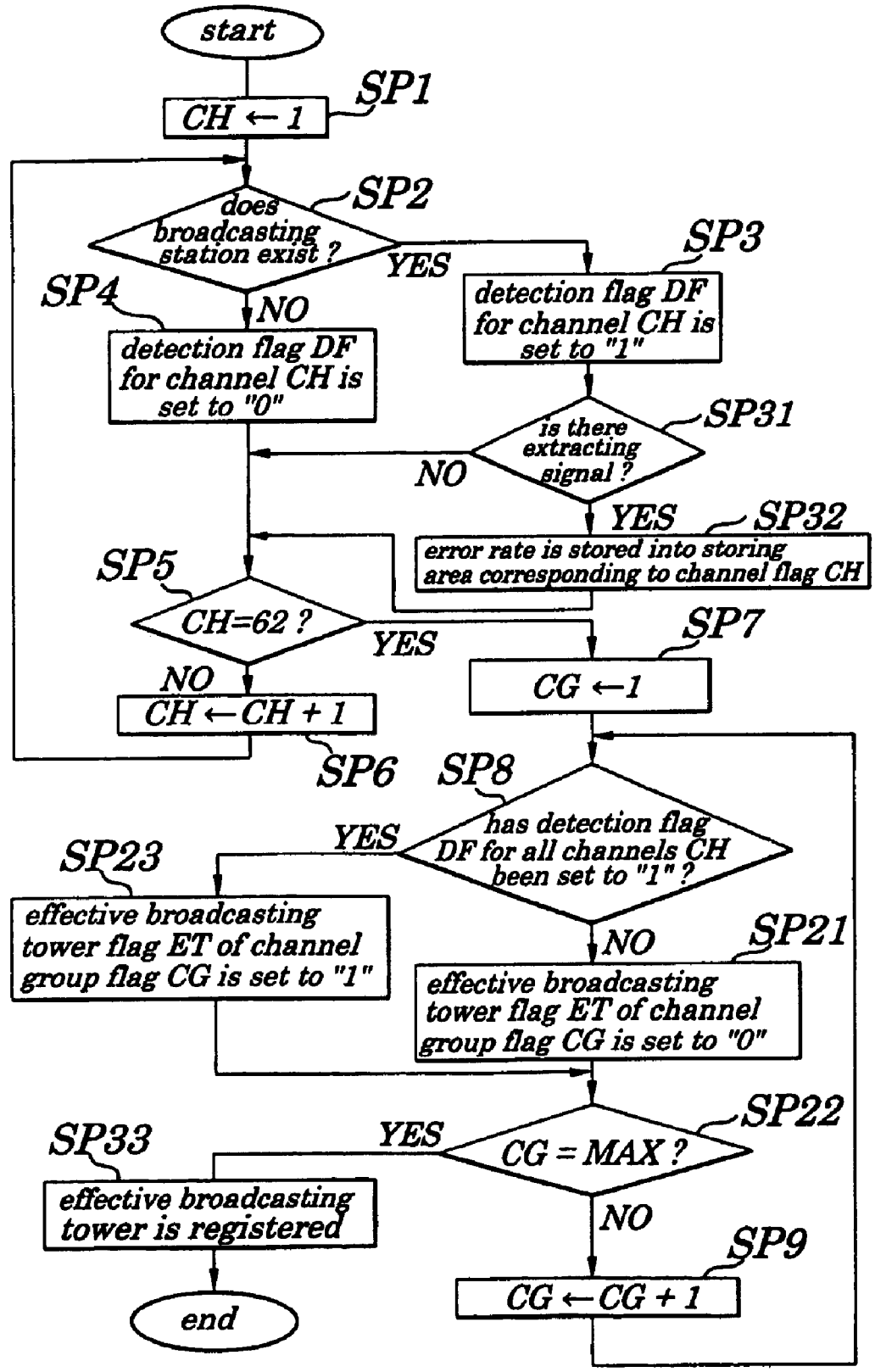
FIG. 5 is a flowchart explaining a method for selecting a broadcasting tower according to the second embodiment of the present invention.

A viewer, after having connected the TV receiver of the embodiment to the receiving antenna 1, provides power to the TV receiver. Then, the viewer, after having manipulated an operation section 11 or a remote controller (not shown) to set the TV receiver to an automatic channel selection mode, selects "Kanagawa" being his/her resident place. This causes the control section 7 to start the automatic channel selecting operation according to a flowchart shown in FIG. 5. That is, the control section 7 first makes its routine proceed to Step SP1 and, after having set all channel flags CH to "1" as an initial value in order to check whether or not broadcast waves on a first channel can be received, proceeds to Step SP2.

Figure 12:
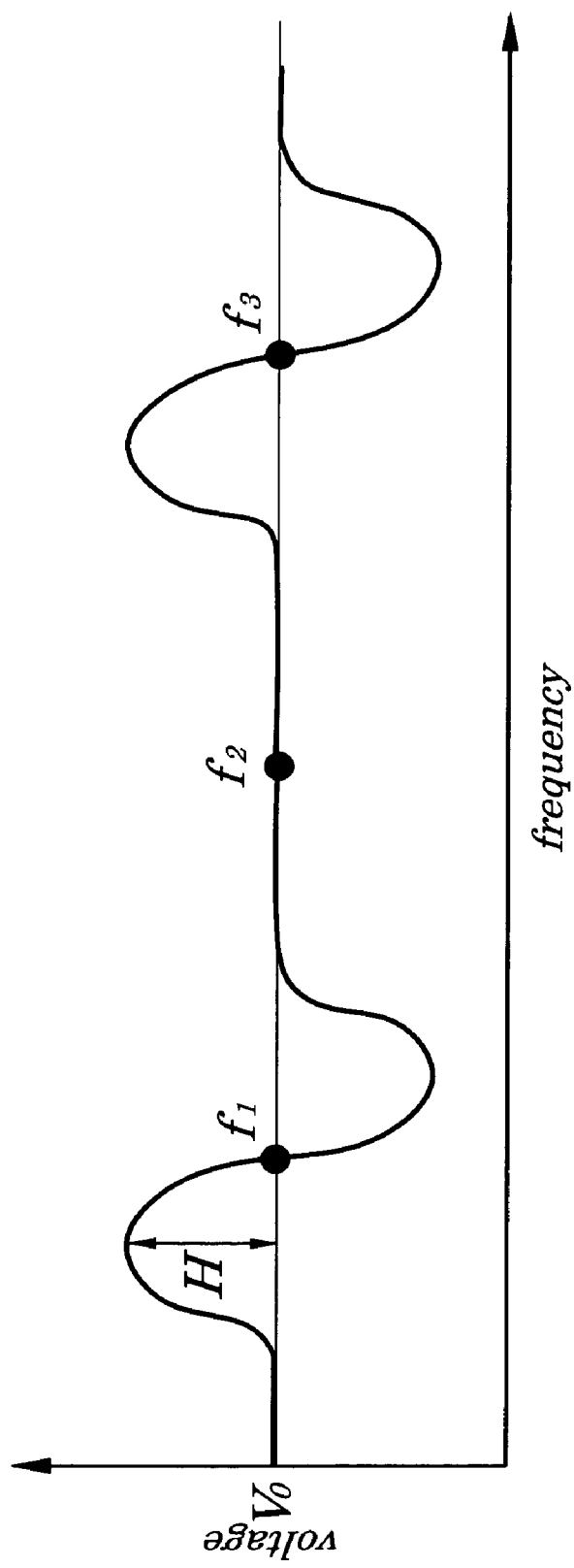
FIG. 12 is a diagram illustrating waveforms of a wave checking signal.

In Step SP2, the control section 7, based on a detected result DR fed from the broadcasting station existence judging section 3, checks whether or not the broadcasting station existence judging section 3 has judged a broadcasting station corresponding to the channel flag CH to exist or not. A method in which the broadcasting station existence judging section 3 judges whether a broadcasting station exists or not has the same processes as the conventional method has and its description is omitted accordingly. If a YES answer is obtained as a result from the judgment in Step SP2, that is, if a broadcasting station corresponding to the channel flag CH is judged to exist, the control section 7 makes its routine proceed to Step SP3. In the embodiment, as is apparent from FIG. 12, since a waveform of the wave checking signal RDW shows that a value of the channel flag CH is "1", that is, that a broadcasting station for the first channel exists, the control section 7 makes its routine proceed to Step SF3.

In Step SP3, the control section 7, after having set a detection flag DF for a channel flag CH provided in a wave receivable channel table 10c (see FIG. 6) to "1", makes its routine proceed to Step SP5. Here, the wave receivable channel table 10c is stored in a receiving broadcasting station storing section 10. In the wave receivable channel table 10c, each of the detection flags DF corresponding to each of the first to sixty-second channels is set to "0" or "1" and an error rate described later is stored therein. In the example, since the broadcasting station corresponding to the first channel is judged to exist in Step SP2, the control section 7, after having set the detection flag DF for the first channel to "1", makes its routine proceed to Step SP31.

In Step SP31, the control section 7 instructs the VBI signal extracting section 32 to extract a VBI signal and judges whether or not an extraction signalEX has been supplied from the VBI signal extracting section 32. If a NO answer is obtained as a result from the judgement, the control section 7 makes its routine proceed to Step SP5. In the example, since the VBI signal is not extracted from a broadcast signal on the first channel, the extraction signalEX is not supplied from the VBI signal extracting section 32 and therefore the control section 7 makes its routine proceed to Step SP5. On the other hand, if a YES answer is obtained as a result from the judgement, that is, if the extraction signalEX has been supplied from the VBI signal extracting section 32, the control section 7 makes its routine proceed to Step SP32. In Step SP32, the control section 7 instructs the error correction processing section 33 to start processing of error correction. Then, the error correction processing section 33, after having made error correction to the VBI signal fed from the VBI signal extracting section 32, feeds an error rate ER measured at the time of the error correction to the control section 7. Therefore, the control section 7, after having stored the error rate ER fed from the error correction processing section 33 into a storing area corresponding to a channel flag CH presented in the wave receivable channel table 10c, makes its routine proceed to Step SP5.

Moreover, if a NO answer is obtained as a result of the judgement in Step SP2, that is, if a broadcasting station corresponding to a targeted channel flag CH is judged not to exist, the control section 7 makes its routine proceed to Step SP4. In Step SP4, the control section 7, after having set a detection flag DF for the channel flag CH presented in the above wave receivable channel table 10c to "0", makes its routine proceed to Step SP5.

In Step SP5, the control section 7 judges whether or not a value of the channel flag CH is "62". If a NO answer is obtained as a result of the judgement, the control section 7 makes its routine proceed to Step SP6. In the example, since the channel flag CH is "1" and not "62", the control section 7 makes its routine proceed to Step SP6. In Step SP6, the control section 7, having incremented a value of the channel flag CH by "1", makes its routine return to Step SP2 and repeats the above processes in Step SP2, SP3, SP4, SP31, and SP32. Then, when the value of the channel flag CH becomes "62", a YES answer is obtained as a result of the judgement in Step SP5 and the control section 7 makes its routine proceed to Step SP7. In the example, by repetition of processes in Step SP2, Step SP3, Step SP4, Step SP31 and SP32, as shown in FIG. 6, each of the detection flags DF for each of the channels presented in the wave receivable table 10c is set to "1" or "0" and, at a same time, an error rate is measured for each of the channels in which the VBI signal is detected and the measured error rate is recorded in the wave receivable table 10c.

In Step SP7, the control section 7, after having set the channel group flag CG to "1" as an initial value in order to check whether or not broadcast waves on all channels belonging to the first channel group (broadcasting channel tower "Tokyo") can be received, makes its routine proceed to Step SP8. In Step SP8, the control section 7 judges whether broadcast waves on all the channels belonging to the channel group corresponding to the channel group flag CG can be received by referring to information about known towers existing in an area selected by the viewer and in its surrounding area out of information about the known towers set up in all parts of Japan being stored in a known tower information storing section 9 and to the wave receivable channel table 10c being stored in the receiving broadcasting station storing section 10. If a NO answer is obtained as a result of the judgement, the control section 7 makes its routine proceed to Step SP21. In the example, as is apparent from comparison between information about broadcasting towers set up in the western region of Kanagawa Prefecture and in regions surrounding the western region shown in FIG. 9 and information contained in the wave receivable channel table 10c shown in FIG. 6, though each of the detection flags DF for the first, third, eighth, twelfth, sixteenth channels belonging to the first channel group (broadcasting channel tower "Tokyo") is set to "1", each of the detection flags DF for the fourth, sixth, tenth, or fourteenth channels also belonging to the first channel group (broadcasting channel tower "Tokyo") is set to "0". Therefore, the control section 7 makes its routine proceed to Step SP21.

In Step SP21, the control section 7, having set an effective broadcasting tower candidate flag ET for the targeted channel group flag CG provided in the effective broadcasting tower table 10d (see FIG. 7) to "0", makes its routine proceed to Step SP22. Here, an effective broadcasting tower table 10d is stored in the receiving broadcasting station storing section 10 so as to represent a state in which either of "0" or "1" is set to each of the effective broadcasting tower flags ET for broadcasting stations contained in information about known broadcasting towers existing in an area selected by the viewer and in its surrounding area and, at a same time, an average of an error rate for a channel in which a VBI signal is extracted out of a plurality of channels belonging to a channel group corresponding to each of values of the channel group flag CG, that is, corresponding to each of broadcasting towers and an order of the average value of the error rate for the channel group corresponding to the error rate are recorded. In the example since broadcast waves on all the channels belonging to the first channel group (broadcasting channel tower "Tokyo") is judged to be unable to be received in Step SP8, the control section 7, having set the effective broadcasting tower candidate flag ET for the first channel group (broadcasting channel tower "Tokyo") to "0", makes it s routine proceed to Step SP22.

In Step SP22, the control section 7 judges whether or not a value of the channel group flag CG is equal to a maximum value MAX. If a NO answer is obtained as a result of the judgement, the control section 7 make s its routine proceed to Step SP9. In the example, though the maximum value MAX is "5" (see FIG. 9), since the value of the channel group flag CG is "1", the control section 7 makes its routine proceed to Step SP9. In Step SP9, the control section 7, after having incremented the value of the channel group flag CG by "1", makes its routine proceed to Step SP8.

If a YES answer is obtained as a result of the judgement, that is, if broadcast waves on all the channels belonging to a channel group corresponding to the channel group flag CG is judged to be able to be received by referring to information about known towers existing in an area selected by the viewer and in its surrounding area out of information about the known towers set up in all parts of Japan being stored in a known tower information storing section 9 and to the wave receivable channel table 10a being stored in the receiving broadcasting station storing section 10, the control section 7 makes its routine proceed to Step SP23. In the example, as is apparent from comparison between FIG. 9 and FIG. 6, since each of the detection flags DF on all the channels belonging to the second channel group (broadcasting tower "Hatano"), the fourth channel group (broadcasting tower "Yugawara"), and the fifth channel group (broadcasting tower "Odawara") is set to "1", if the value of the channel group flag CG is set to "2", "4" or "5", the control section 7 makes its routine proceed to Step SP23.

In Step SP23, the control section 7, after having set the effective broadcasting tower candidate flag ET, corresponding to the channel group indicated by the channel group flag CG, provided in the effective broadcasting tower table 10d shown in FIG. 7 to "1", makes its routine proceed to Step SP22. In the example, as shown in FIG. 7, if a value of the channel group flag CG is set to "2", "4", or "5", the control section 7 sets the corresponding effective broadcasting tower candidate flag ET to "1".

Then, when the value of the channel group flag CG becomes a MAX value, a YES answer is obtained as a result of the judgement in Step SP22 and therefore the control section 7 makes its routine proceed to Step SP33. In the example, if the value of the channel group flag CG becomes "5", the control section 7 makes its routine proceed to Step SP33. In Step SP33, the control section 7 sums up an error rate for each channel being stored in the wave receivable channel table 10c by channel, that is, by broadcasting tower and calculates an error rate average by dividing the summed values by a number of channels in which a VBI signal is extracted and once stores the calculated value in the effective broadcasting tower table 10d shown in FIG. 7. Next, the control section 7, compares the average values of the error rate for each of the broadcasting towers being stored in the effective broadcasting tower table 10d shown in FIG. 7 and assigns an order number in increasing order of the error rate average value and then stores the order number in the effective broadcasting tower table 10d shown in FIG. 7. In the example shown in FIG. 7, since the error rate average value for the broadcasting tower "Odawara" is "1", error rate average value for the broadcasting tower "Yugawara" is "42.7" and error rate average for the broadcasting tower "Hatano" is "62.3", the order of the error rate average value for the broadcasting tower "Odawara" takes a first place, the order for the broadcasting tower "Yugawara" takes a second place, and the order for the broadcasting tower "Hatano" takes a third place. This causes the control section 7 to store the broadcasting tower whose order of the error rate average value takes the first place as an effective broadcasting tower in the receiving broadcasting station storing section 10 and then to terminate a series of the processing. In the example, the control section 7 stores the broadcasting tower "Odawara" as the effective broadcasting tower in the receiving broadcasting station storing section 10.

Thus, according to the method for selecting a broadcasting tower employed in the embodiment, an error rate in processing of error correction to a VBI signal is obtained by extracting the VBI signal from a broadcast signal on each channel and the error rate average value for every broadcasting tower is calculated and the broadcasting tower whose order of the error rate average value takes the first place is registered as an effective broadcasting tower. This enables avoidance of imposition of inconvenience on the viewer compared with the case of the above first embodiment thus improving operability.

MODIFIED EXAMPLE

Figure 8:
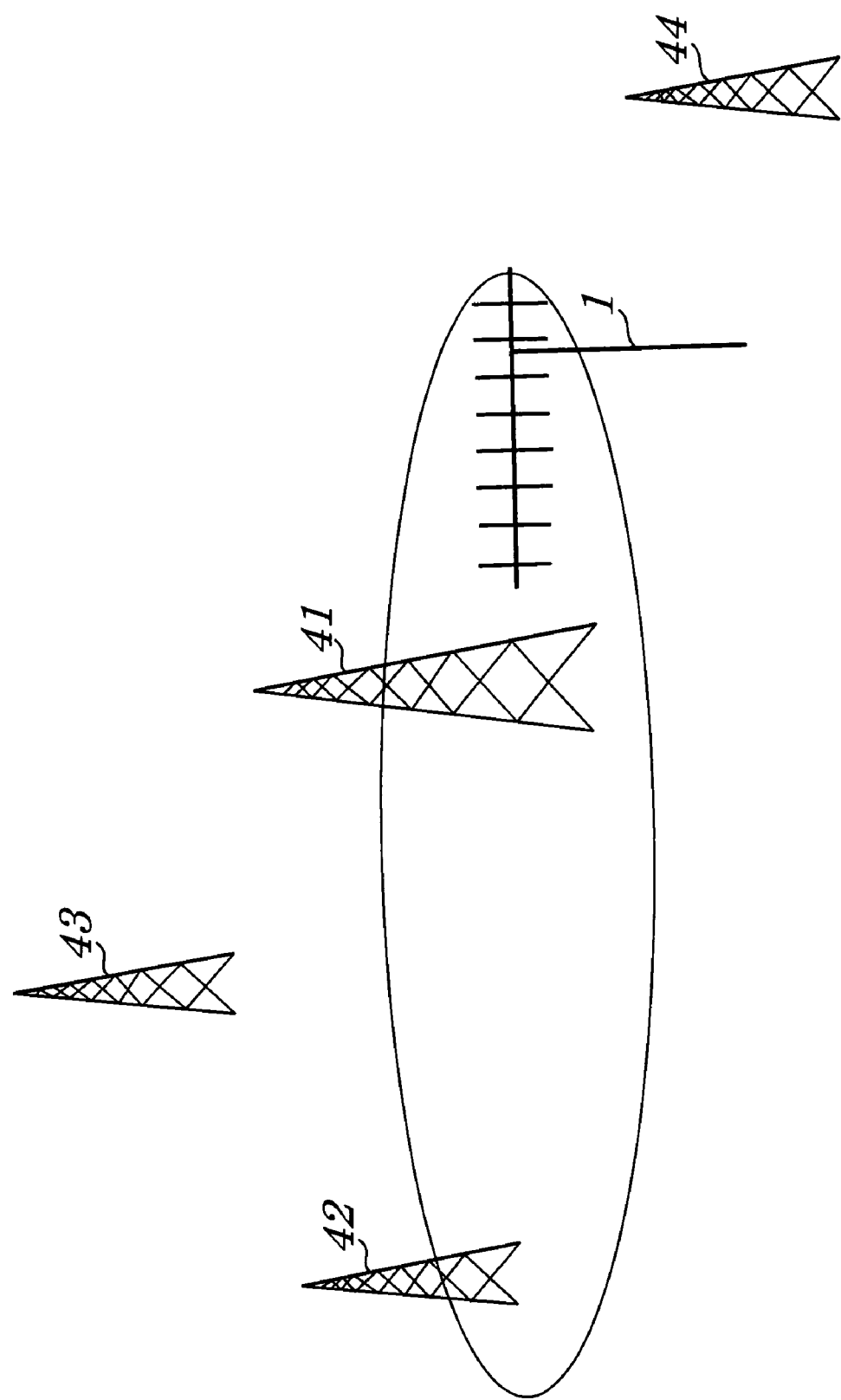
FIG. 8 is a diagram illustrating a modified example of the present invention.

In each of the above embodiments, based on information about broadcasting towers being registered as an effective broadcasting tower and/or information about an effective broadcasting tower candidate, rough recognition of a place (area) in which a TV receiver is installed is possible. For example, in FIG. 8, if it is assumed that a place where a receiving antenna 1 is positioned is a place where a TV receiver is positioned, based on information about the broadcasting tower being registered as the effective broadcasting tower in the first and second embodiments and/or information about the effective broadcasting tower candidate. It is to be understood that in FIG. 8 that a broadcasting tower 41 is a broadcasting tower "Odawara", a broadcasting tower 42 is a broadcasting tower "Yugawara", a broadcasting tower 43 is a broadcasting tower "Hatano", and a broadcasting tower 44 is a broadcasting tower "Ashigara". This is because the broadcasting tower "Odawara", broadcasting tower 41, is registered as the effective broadcasting tower and, in the second embodiment, as is understood from an effective broadcasting tower table 10d shown in FIG. 7, an order of the error rate average value of the broadcasting tower "Yugawara", broadcasting tower 42, is more excellent than that of a broadcasting tower "Hatano", broadcasting tower 43. Thus, in the TV receiver in the modified embodiment of the present invention, even if contents of a TV program on a channel are same in a nationwide area or in a wider area (for example, Kanto area), information about contents related to an area (for example, Ibaragi prefecture) other than the area in which the TV receiver is positioned can be deleted and, instead of that, information about the area in which the TV receiver is positioned including event information, weather forecast, notification of occurrence state of an accident, or a like can be provided. By operating as above, a viewer can obtain only information which is really required, thereby improving usability of the TV receiver.

Moreover, by adding a communication unit being connectable to the Internet through a public telephone network or a like to the TV receiver, a telecasting broadcasting station can get information about an audience rating of a TV program by area and about a number of viewers receiving broadcast waves from the broadcasting tower. This enables the broadcasting station to easily work out a set-up plan of various broadcasting equipment in the area.

It is apparent that the present invention is not limited to the above embodiments but may be changed and modified without departing from the scope and spirit of the invention. For example, in the above embodiments, only one broadcasting tower is registered as an effective broadcasting tower. However, if a plurality of broadcasting towers showing little difference in terms of their effectiveness, any one of the broadcasting towers may be registered so long as it is effective.

Also, in the above first embodiment, the TV receiver is equipped with one tuner, however, the present invention is not limited to this. That is, the present invention may be applied to a TV receiver being equipped with a plurality of tuners. In this case, telecasting broadcasts being given by a same broadcasting station and being transmitted from different broadcasting towers to each tuner are received simultaneously and displayed on a display unit to let the viewer compare them. Also, in the TV receiver being equipped with one tuner, TV programs (including moving videos or still videos) being broadcast by a same broadcasting station and being transmitted from different broadcasting towers, after having been sequentially received, are displayed on a display unit to let the viewer compare them.

Also, in the above second embodiment, an example is shown in which, in Step SP33, an error rate average value for every broadcasting tower is calculated and a broadcasting tower having a smallest error rate is registered as an effective broadcasting tower. The present invention is not limited to this. For example, a sum of error rates of all the channels, maximum error rate, or error rate of one channel (these being collectively called values related to error rates) is obtained for every broadcasting tower and a broadcasting tower having a smallest value related to the error rate may be registered as an effective broadcasting tower.

Also, in each of the embodiments, an example is shown in which the present invention is applied to the telecasting broadcast, however, the present invention is not limited to this and can be applied to an FM (Frequency Modulation) broadcast.

Also, in each of the embodiments, an example is shown in which the present invention is applied to analog broadcasting, however, the present invention is not limited to this and can be applied to digital broadcasting.

Also, in each of the embodiments, an example is shown in which the present invention is applied to the TV receiver, however, the present invention is not limited to this and can be applied to a personal computer being equipped with a telecasting broadcast receiving function.

Furthermore, in the above first embodiment, an example is shown in which all broadcasting towers set up in an area and in its surrounding areas are displayed on a receiving state confirming screen displayed on the display section, however, the present invention is not limited to this and only an effective broadcasting tower candidate may be displayed on the screen. Examples are given for Japan but locations are not limited to those of only Japan.

What is claimed is:

1. A broadcasting tower selecting method for selecting one broadcasting tower out of a plurality of broadcasting towers, each being able to transmit together broadcast waves on a plurality of channels that can be received in an area, comprising:
    a first step of judging an existence or not of said channels that can be received in said area;
    a second step of judging whether all channels belonging to a channel group can be received;
    a third step of extracting, based on a result from the judgment in said second step, one or more broadcasting towers that can provide all channels belonging to said channel group, said channels being receivable in said area, out of said plurality of said broadcasting towers, and of setting one or more effective broadcasting tower candidate flags for the extracted one or more broadcasting towers, enabling selection of a preferable broadcasting tower, and where channel groups are used to determine the effective broadcasting tower candidate flag; and
    a fourth step of selecting one arbitrary broadcasting tower out of the extracted one or more broadcasting towers, using said one or more effective broadcasting tower candidate flags.

2. The broadcasting tower selecting method according to claim 1, wherein, in said fourth step, after programs on each channel transmitted from said extracted one or more broadcasting towers have been presented to a viewer or a listener, said one arbitrary broadcasting tower specified by said viewer or said listener is selected out of said extracted one or more broadcasting towers.

3. The broadcasting tower selecting method according to claim 1, wherein, in said first step, an error rate occurring when error correction is made to a data signal contained in a broadcasting signal on said each channel is calculated and wherein, in said fourth step, a broadcasting tower having a minimum value of said error rate for said each channel being transmitted from said extracted one or more broadcasting towers is selected.

4. The broadcasting tower selecting method according to claim 1, further comprising a fifth step of recognizing, based on information about the selected broadcasting tower, an area in which a broadcast receiving device is located.

5. A broadcast receiving device comprising:
- a broadcasting station judging section to judge existence of broadcast channels that can be received;
- a Vertical Blanking Interval signal extracting section for transmitting Vertical Blanking Interval signals;
- an error correction processing section enabling transmission of data even if the VBI signal is effected by noise; and
- a control section to extract, based on a result from the judgment, one or more broadcasting towers that can provide all channels being receivable in an area out of said one or more broadcasting towers, each being able to transmit together broadcast waves on a plurality of channels that can be received in said area, and to set one or more effective broadcasting tower candidate flags for the extracted one or more broadcasting towers, and where channel groups are used to determine the effective broadcasting tower candidate flag, and to select one arbitrary broadcasting tower out of the extracted one or more broadcasting towers, using said one or more effective broadcasting tower candidate flags.

6. The broadcast receiving device according to claim 5, wherein said control section, after having presented programs on each channel transmitted from the extracted one or more broadcasting towers to a viewer or a listener, selects a broadcasting tower specified by said viewer or said listener out of the extracted one or more broadcasting towers.

7. The broadcast receiving device according to claim 5, further comprising an error correction processing section to calculate an error rate occurring when error correction is made to a data signal contained in a broadcasting signal on said each channel and wherein, said control section selects a broadcasting tower having a minimum value of said error rate for said each channel being transmitted from the extracted one or more broadcasting towers.

8. The broadcast receiving device according to claim 5, wherein said control section recognizes, based on information about the selected broadcasting tower, an area in which said broadcast receiving device is located.

9. A broadcasting tower selecting program stored in a computer-readable storage medium to have a computer execute a method for selecting one broadcasting tower out of a plurality of broadcasting towers, each being able to transmit together broadcast waves on a plurality of channels that can be received in an area, said method comprising:
- a first step of judging an existence or not of said channels that can be received in said area;
- a second step of judging whether all channels belonging to a channel group can be received;
- a third step of extracting, based on a result form the judgment in said first step, one or more broadcasting towers that can provide all channels belonging to said channel group, said channels being receivable in said area, out of said plurality of said broadcasting towers, and of setting one or more effective broadcasting tower candidate flags for the extracted one or more broadcasting towers, enabling selection of a preferable broadcasting tower, and where channel groups are used to determine the effective broadcasting tower candidate flag; and
- a fourth step of selecting one arbitrary broadcasting tower out of the extracted one or more broadcasting towers, using said one or more effective broadcasting tower candidate flags.

10. The broadcasting tower selecting program stored in a computer-readable storage medium according to claim 9, wherein, said fourth step, after programs on each channel transmitted from said extracted one or more broadcasting towers have been presented to a viewer or a listener, one arbitrary broadcasting tower specified by said viewer or said listener is selected out of said extracted one or more broadcasting towers.

11. The broadcasting tower selecting program stored in a computer-readable storage medium according to claim 9, wherein, in said first step, an error rate occurring when error correction is made to a data signal contained in a broadcasting signal on said each channel is calculated and wherein, in said fourth step, a broadcasting tower having a minimum value of said error rate for said each channel being transmitted from said extracted one or more broadcasting towers is selected.

12. The broadcasting tower selecting program stored in a computer-readable storage medium according to claim 9, further comprising a fifth step of recognizing, based on information about the selected broadcasting tower, an area in which a broadcast receiving device is located.

13. A computer-readable storage medium storing a broadcasting tower selecting program to have a computer execute a broadcasting tower selecting method for selecting one broadcasting tower out of a plurality of broadcasting towers, each being able to transmit together broadcast waves on a plurality of channels that can be received in an area, said method comprising:
- a first step of judging an existence or not of said channels that can be received in said area;
- a second step of judging whether all channels belonging to a channel group can be received;
- a third step of extracting, based on a result from the judgment in said first step, one or more broadcasting towers that can provide all channels belonging to said channel group, said channels being receivable in said area, out of said plurality of said broadcasting towers, and of setting one or more effective broadcasting tower candidate flags for the extracted one or more broadcasting towers, enabling selection of a preferable broadcasting tower, and where channel groups are used to determine the effective broadcasting tower candidate flag; and
- a fourth step of selecting one arbitrary broadcasting tower out of the extracted one or more broadcasting towers, using said one or more effective broadcasting tower candidate flags.

* * * * *